US005592166A

United States Patent [19]

Wincn

[11] Patent Number: 5,592,166

[45] Date of Patent: Jan. 7, 1997

[54] HIGH SPEED CMOS D/A CONVERTER FOR WAVE SYNTHESIS IN NETWORK

[75] Inventor: John M. Wincn, Cupertino, Calif.

[73] Assignee: Advanced Micro Devices Inc., Sunnyvale, Calif.

[21] Appl. No.: 458,969

[22] Filed: Jun. 2, 1995

[51] Int. Cl.$^{6}$ .................................................. H03M 1/66

[52] U.S. Cl. .......................................... 341/144; 341/135

[58] Field of Search .................................. 341/144, 135, 341/145, 147, 153, 154

[56] References Cited

U.S. PATENT DOCUMENTS

| | | | |
|---|---|---|---|
| 3,699,568 | 10/1972 | Thompson et al. | 341/144 |
| 5,148,164 | 9/1992 | Nakamura et al. . | |
| 5,254,994 | 10/1993 | Takakura et al. . | |
| 5,276,716 | 1/1994 | Wincn . | |
| 5,331,322 | 7/1994 | Cha et al. . | |
| 5,343,196 | 8/1994 | Harston | 341/136 |
| 5,357,145 | 10/1994 | Segaram . | |

*Primary Examiner*—Brian K. Young
*Attorney, Agent, or Firm*—Townsend and Townsend and Crew LLP

[57] ABSTRACT

A high speed digital-to-analog (D/A) converter (DAC) includes a plurality of least significant bit (LSB) cells that collectively define a total output of the DAC. Each LSB cell includes a differential current driver that has reduced capacitive loading due to a cascode structure of the current driver wherein transistors are biased to desired levels and current sources are switched on and off to control the differential output signal.

4 Claims, 2 Drawing Sheets

HIGH SPEED CMOS D/A CONVERTER FOR WAVE SYNTHESIS IN NETWORK

CROSS-REFERENCE TO RELATED APPLICATIONS

This application is related to "A PRECISE DELAY LINE CIRCUIT WITH PREDETERMINED RESET TIME LIMIT," U.S. patent application Ser. No. 08/214,897 filed Mar. 17, 1994 hereby expressly incorporated by reference for all purposes.

BACKGROUND OF THE INVENTION

The present invention relates generally to semiconductor integrated circuits and more specifically to integration of waveshaping functions into an integrated circuit that drives a differential signal onto a local area network.

U.S. Pat. No. 5,357,145 titled Integrated Waveshaping Circuit Using Weighted Current Summing and Issued Oct. 18, 1994 describes relevant background for understanding the present invention, as well as describing one conventional solution to on-chip wave synthesis.

Various network protocols such as IEEE Standards 802.3 (Ethernet) and 10Base-T (twisted pair), both hereby expressly incorporated by reference for all purposes, define operational characteristics for various data signals. To implement a data transmitter for twisted pair wiring using an integrated circuit solution, many conventional systems rely on external filter elements to properly shape the output wave.

U.S. Pat. No. 5,357,145, hereby expressly incorporated by reference for all purposes, illustrates a solution to wave shaping incorporating a weighted sum solution that provides an output waveform designed to represent a shape of an output signal after it has passed through a filter. The solution disclosed in the U.S. Pat. No. 5,357,145 provides a plurality of current cells that are controlled in a fashion so that output contributions of the various cells provide the desired wave shape. Generically, this conversion process defines a digital to analog (D/A) converter or DAC implementation.

For effective operation, construction and control of the current cells is important to provide a robust, fast, and reliable D/A converter for use in waveform synthesis. The solution described in U.S. Pat. No. 5,357,145 provides a current cell that may have excessive parasitic capacitance that can limit an operational speed of the D/A converter.

SUMMARY OF THE INVENTION

The present invention provides apparatus and method for simply, efficiently and economically improving performance over conventional D/A converters. The preferred embodiment provides an improved performance partially because of a decrease in capacitive loading of current output drivers used in least significant bit cells making up the improved D/A converter. Thus, the improved D/A converter may be faster and produce less distortion than conventional D/A converters.

According to one aspect of the invention, a least significant bit (LSB) cell for an integrated digital to analog converter that drives an incremental current at each of a first and a second output node, includes a first and second matching MOS transistor, each having a first terminal node, a second terminal node and a gate terminal node, the gate terminal nodes receiving a bias current for controlling an operating current between the first terminal node and second terminal node and wherein the first terminal node of the first MOS transistor is coupled to the first output node and the first terminal node of the second MOS transistor is coupled to the second output node. Additionally, the LSB cell includes a first current source having a first current terminal coupled to the second terminal node of the first MOS transistor and a second current terminal coupled to a voltage reference level, the first current source is responsive to a first control signal for switching a first operating current through the first MOS transistor on when the first control signal has a first value and switching the first operating current through the first MOS transistor off when the first control signal has a second value; and a second current source having a first current terminal coupled to the second terminal node of the second MOS transistor and a second current terminal coupled to the voltage reference level, the second current source responsive to a second control signal for switching a second operating current through the second MOS transistor on when the second control signal has a first value and switching the second operating current through the second MOS transistor off when the second control signal has a second value.

Reference to the remaining portions of the specification, including the drawing and claims, will realize other features and advantages of the present invention. Further features and advantages of the present invention, as well as the structure and operation of various embodiments of the present invention, are described in detail below with respect to accompanying drawing. In the drawing, like reference numbers indicate identical or functionally similar elements.

DESCRIPTION OF THE PREFERRED EMBODIMENT

Figure 1:
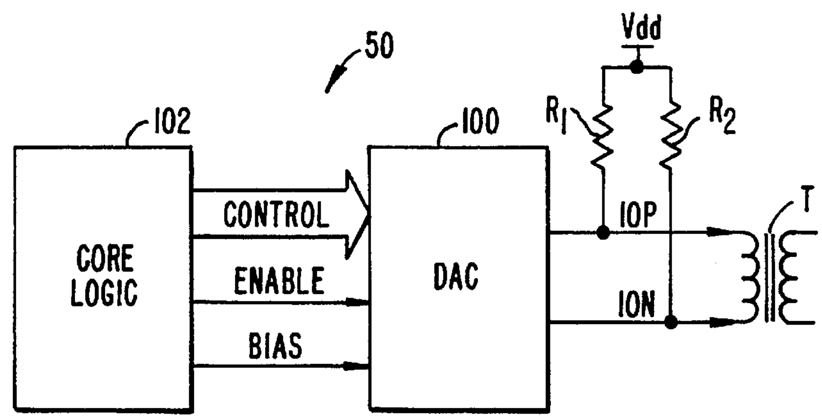
FIG. 1 is a schematic block diagram of a preferred embodiment of a twisted pair transmitter 50 including a high speed digital to analog converter (DAC) 100 for wave synthesis.

FIG. 1 is a schematic block diagram of a preferred embodiment of a twisted pair transmitter 50 including a high speed digital to analog converter (DAC) 100 for wave synthesis. Twisted pair transmitter includes a core logic circuit 102 that provides a plurality of control signals, an enable signal and a bias signal to DAC 100. These signals define operation of DAC 100 and control a differential signal driven on a differential output (IOP and ION) of DAC 100. As well known in the art, a resistor R1 couples IOP to Vdd and a resistor R2 couples ION to Vdd. Additionally, the differential signal at IOP and ION is provided to a transformer T.

In operation, core logic 102 determines the shape of the differential signal to be driven from the output of DAC 100. As will be explained in further detail later, core logic 102 selects a combination of control signals to drive the output differential signal to the desired level. In order to operate DAC 100, core logic 102 first asserts the enable signal to DAC 100 to enable its operation. With the enable signal deasserted, DAC 100 dissipates very low levels of power irrespective of the status of the control signals and the bias signal.

After asserting the enable signal, core logic 102 asserts the bias signal to DAC 100, and selective ones of the control signals. In response to particular combinations of the control signals (while enable and bias are asserted), DAC 100 drives the output differential signal at the desired levels. Details regarding operation of DAC 100 are explained more specifically with regard to FIGS. 2–6 below.

Figure 2:
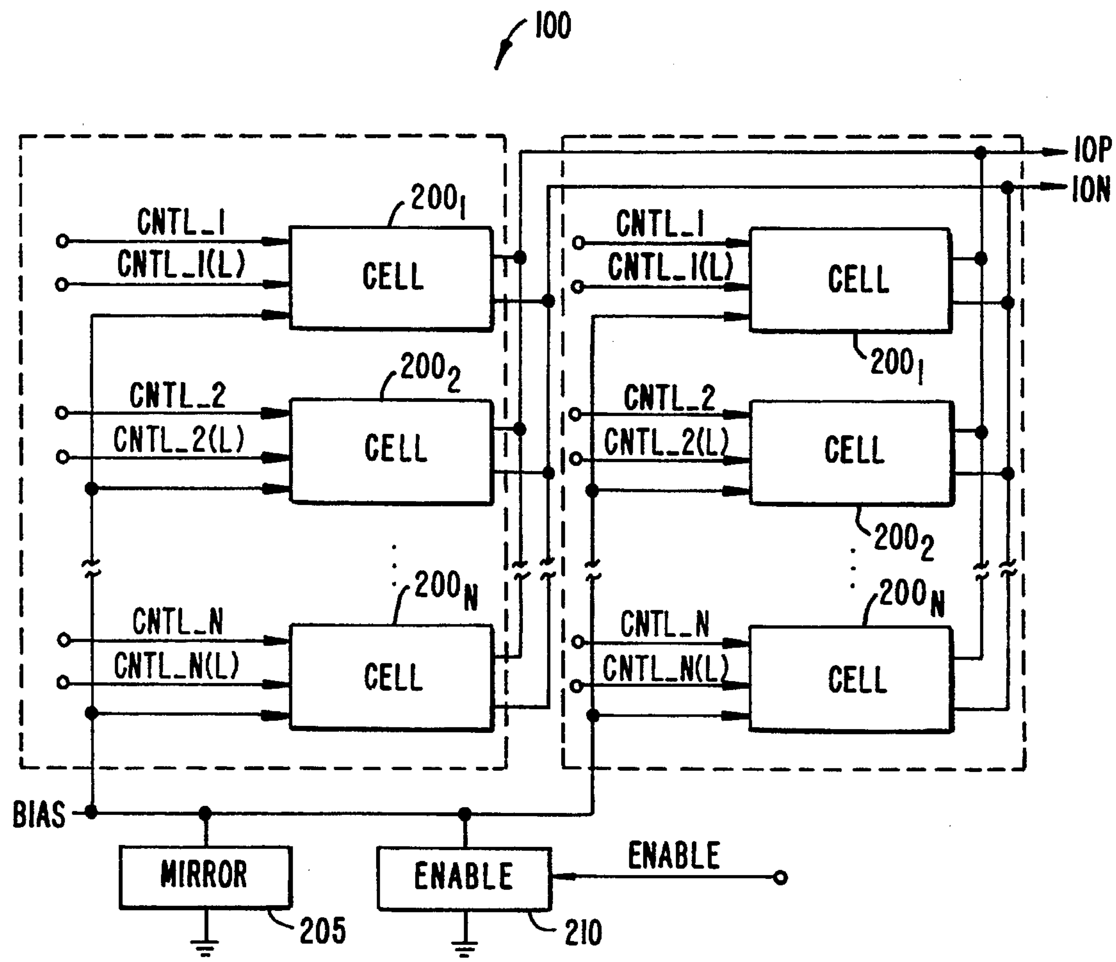
FIG. 2 is a block schematic diagram of DAC 100.

FIG. 2 is a block schematic diagram of DAC 100. DAC 100 includes a plurality of cells $\mathbf{200}_i$ that each respond to selected ones of the control signals to add a predetermined amount of current to collectively define the differential output signal. Additionally, DAC 100 includes a mirror circuit 205 and an enable circuit 210. Mirror circuit 205 is responsive to the bias signal to establish a mirror current that is provided to each of the plurality of cells $\mathbf{200}_i$. Enable circuit 210, responsive to the enable signal, controls distribution of the mirror current to the plurality of cells **200*i*. When the enable signal is deasserted, enable circuit 210** inhibits distribution of the mirror current, thereby deactivating the plurality of cells $\mathbf{200}_i$.

Figure 3:
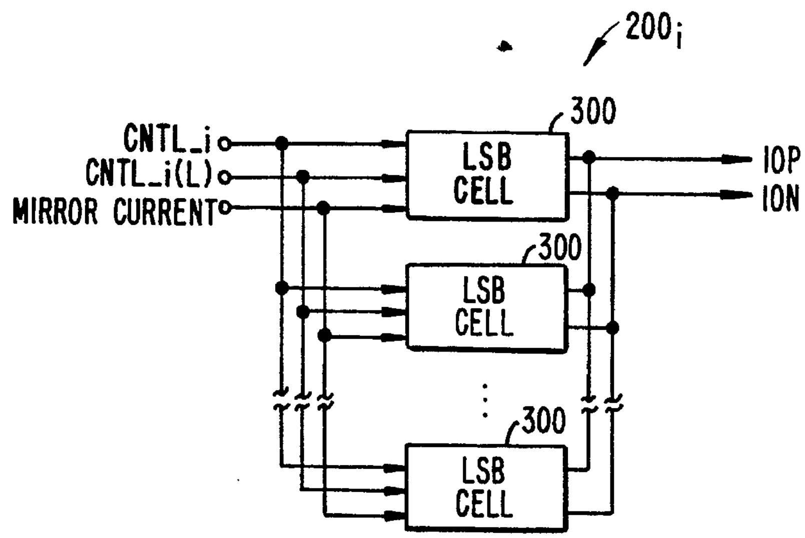
FIG. 3 is a detail block diagram of cell **200*i* shown in FIG. 2**.

Each cell $\mathbf{200}_i$ of the preferred embodiment has a slightly different configuration, details of which are explained with regard to FIG. 3. Each cell $\mathbf{200}_x$ is responsive to a differential control signal having a first component CNTL_X and a second component CNTL_X(L). Each cell 200 thus receives the mirror current and a differential control signal.

In operation, assertion of the bias signal and assertion of the enable signal by core logic 102 shown in FIG. 1 establishes the mirror current for each cell $\mathbf{200}_i$. Thereafter, depending upon particular ones of the differential control signals asserted by core logic 102, particular ones of the plurality of cells $\mathbf{200}_i$ add a predetermined amount of current to the differential output signal. For example in the preferred embodiment, cell $\mathbf{200}_1$ may add 10 milliamps (mA), cell $\mathbf{200}_2$ may add 6 mA, etc. With enough cells provided to uniquely define the desired output range of DAC 100, the combination of cells **200*i*** produce a simple mechanism to convert input digital signals (the combination of the control differential signals) into an analog output (the output differential signal at IOP and ION).

In the preferred embodiment, the plurality of cells **200*i* are divided into two subgroups (220 and 225). These subgroups of cells are provided in parallel to improve layout efficiency when integrated into a semiconductor device. Thus, for specific embodiments, the particular groupings of the plurality of cells 200*i* may be different. In the preferred embodiment, each subgroup includes two 10 mA cells, one 6 mA cell, three 4 mA cells, two 3 mA cells, two 2 mA cells, and two 1 mA cells. Corresponding cells in the respective subgroups are responsive to the same control differential signal. Again, particular embodiments may use different numbers or configurations of cells 200*i***.

FIG. 3 is a detail block diagram of cell **200*i* shown in FIG. 2. A particular cell 200*i* includes one or more least significant bit (LSB) cells 300. LSB cells 300 making up a particular cell 200*i* are coupled to each other in parallel to receive the control differential signal (CNTL_i and CNTL_i(L)) and the mirror current. Each LSB cell 300 of the preferred embodiment provides the same amount of drive current. In the preferred configuration illustrated in FIG. 3, each LSB cell 300 provides one-half of the minimum step of DAC 100. In the preferred embodiment, LSB 300 drives one-half milliamp, allowing for a 1 mA cell 200**.

Figure 4:
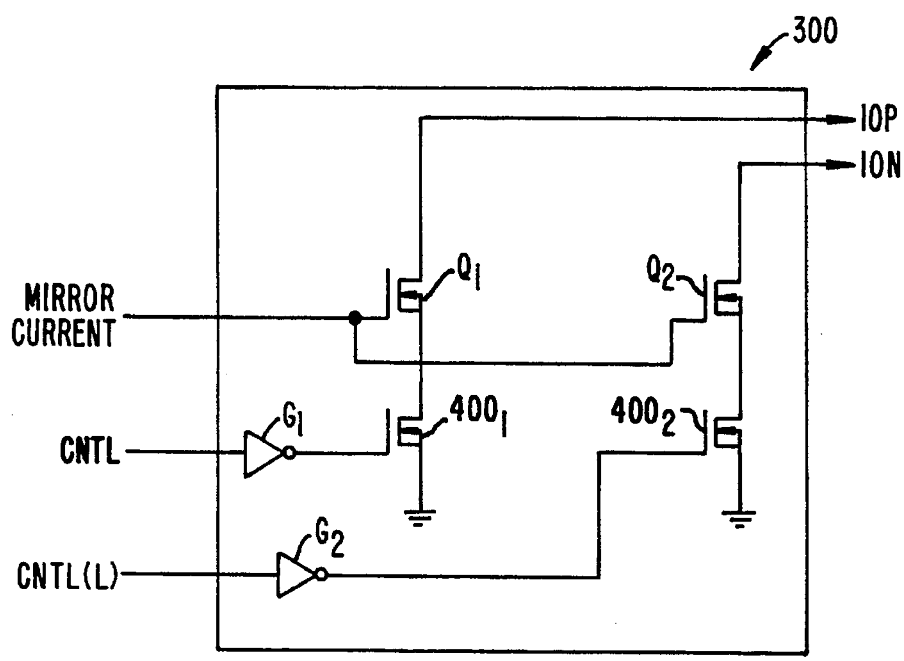
FIG. 4 is a detailed schematic diagram of LSB cell 300 shown in FIG. 3.

FIG. 4 is a detailed schematic diagram of LSB cell 300 shown in FIG. 3. LSB cell 300 includes two N-channel metal oxide field-effect transistors (MOSFETs) Q1 and Q2, two switchable current sources 400, and two inverters G1 and G2. Transistor Q1 and transistor Q2 each include a gate for receipt of the mirror current provided from mirror circuit 205 shown in FIG. 2. Transistor Q1 and transistor Q2 are, in the preferred embodiment, identical to each other and are scaled relative to a transistor in mirror circuit 205 (as described further below) to produce a preselected current level in response to the bias signal provided from core logic 205 shown in FIG. 2. Transistor Q1 includes a drain coupled to an IOP output port and transistor Q2 includes a drain coupled to an ION output port. A source of transistor Q1 is coupled to a first terminal of one current source $\mathbf{400}_1$ and a source of transistor Q2 is coupled to a first terminal of the other current source $\mathbf{400}_2$. A second terminal of each of the current sources 400 is coupled to a first reference voltage (e.g., ground). Each current source 400 has a control terminal for receipt of a control signal. Assertion of the control signal to current source $\mathbf{400}_1$ results in activation of current source $\mathbf{400}_1$. Similarly, assertion of the control signal to current source $\mathbf{400}_2$ activates current source $\mathbf{400}_2$.

An output of first inverter G1 is coupled to the control terminal of current source $\mathbf{400}_1$ and an output of second inverter G2 is coupled to the control terminal of current source $\mathbf{400}_2$. An input of first inverter G1 receives one component of the control differential signal (in the preferred embodiment, the input of G1 receives the CNTL component). An input of second inverter G2 receives the other component (the complement to CNTL) of the control differential signal (i.e., the CNTL(L) component). In the preferred embodiment, current sources 400 are implemented as MOS transistors.

In operation, assertion of the mirror current to transistor Q1 and to transistor Q2 attempts to establish a scaled current from either IOP or ION to the first voltage reference level. Whether one of the currents is established or not depends upon which, if any, of the control signals are asserted to which of the current sources 400. When CNTL is deasserted (CNTL(L) is asserted), first inverter G1 activates current source $\mathbf{400}_1$ by asserting the control signal to current source $\mathbf{400}_1$ and second inverter G2 deactivates current source $\mathbf{400}_2$ by deasserting the control signal to current source $\mathbf{400}_2$. Activating current source $\mathbf{400}_1$ while the mirror current is asserted to the gate of first transistor Q1 drives a current at IOP. Similarly, activating current source $\mathbf{400}_2$ by reversing the state of the control differential signal while the mirror current is asserted to the gate of the second transistor Q2 drives a current at ION. In the preferred embodiment, because the control signal is a differential signal, one of transistor Q1 or transistor Q2 will be ON provided the mirror current voltage bias is applied to the gates of the transistors.

Figure 5:
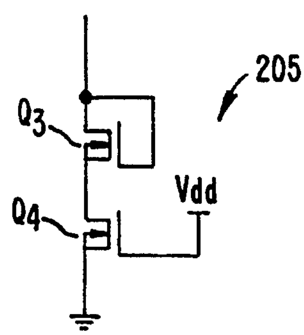
FIG. 5 is a schematic diagram of mirror circuit 205 shown in FIG. 2.

FIG. 5 is a schematic diagram of mirror circuit 205 shown in FIG. 2. Mirror circuit 205 of the preferred embodiment includes a third N-channel MOSFET Q3 coupled in series to a fourth N-channel MOSFET Q4. A drain and gate of MOSFET Q3 is coupled to the bias input for receiving the bias input current while a source of MOSFET Q3 is coupled to a drain of MOSFET Q4. A source of MOSFET Q4 is coupled to the first voltage reference level. A gate of MOSFET Q3 is coupled to the drain of MOSFET Q3 and a gate of MOSFET Q4 is coupled to a second voltage reference level (e.g., Vdd). Configuring MOSFET Q3 and MOS- FET Q4 in this fashion forms one part of a current mirror. It is one important aspect of the preferred embodiment to closely match transistor Q1 and transistor Q2 of each LSB 300 to MOSFET Q3 in order to complete the current mirror. In the preferred embodiment, it is also important that the transistors of current sources 400 (shown in FIG. 4) match each other and match transistor Q4.

Figure 6:
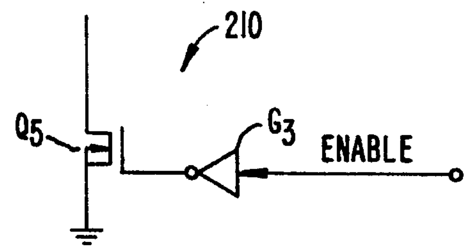
FIG. 6 is a schematic diagram of enable circuit 210 shown in FIG. 2.

FIG. 6 is a schematic diagram of enable circuit 210 shown in FIG. 2. Enable circuit 210 includes an N-channel MOSFET Q5 and an inverter G3. A drain of MOSFET Q5 is coupled to the drain of MOSFET Q3 shown in FIG. 5 and a source of MOSFET Q5 is coupled to the first voltage reference level. A gate of MOSFET Q5 is coupled to an output of inverter G3. The enable signal is provided to an input of inverter G3. When the output of inverter G3 has a binary one level (HIGH), MOSFET Q5 is active. When MOSFET Q5 is active, MOSFET Q5 disables the mirror circuit by shunting bias current away from transistor Q3 and transistor Q4 and prevents application of the mirror current to any of the LSB cells 300. To assert the output of inverter G3, the enable signal has a binary zero level (LOW). Thus, asserting the enable signal in this case means that the enable signal is active high.

In conclusion, the present invention provides a simple, efficient solution to a problem of providing a high-speed DAC for use in wave synthesis when communicating over a twisted pair network. While the above is a complete description of the preferred embodiments of the invention, various alternatives, modifications, and equivalents may be used. Therefore, the above description should not be taken as limiting the scope of the invention which is defined by the appended claims.

What is claimed is:

1. A least significant cell for an integrated digital to analog converter for driving an incremental current at each of a first and a second output node, comprising:

a first and second matching MOS transistor, each having a first terminal node, a second terminal node and a gate terminal node, said gate terminal nodes receiving a bias current for controlling an operating current between said first terminal node and second terminal node and wherein said first terminal node of said first MOS transistor is coupled to the first output node and said first terminal node of said second MOS transistor is coupled to the second output node;

a first current source having a first current terminal coupled to said second terminal node of said first MOS transistor and a second current terminal coupled to a voltage reference level, said first current source responsive to a first control signal for switching a first operating current through said first MOS transistor on when said first control signal has a first value and switching said first operating current through said first MOS transistor off when said first control signal has a second value; and a second current source having a first current terminal coupled to said second terminal node of said second MOS transistor and a second current terminal coupled to said voltage reference level, said second current source responsive to a second control signal for switching a second operating current through said second MOS transistor on when said second control signal has a first value and switching said second operating current through said second MOS transistor off when said second control signal has a second value.

2. A CMOS digital to analog converter, comprising:

a controller for providing a first and a second set of complementary control signals that collectively identify a desired current output level for a complementary output and for providing a bias current signal;

a first MOS mirror transistor responsive to said bias current signal to establish a mirror current at a mirror current terminal;

a first current cell receiving said first set of complementary control signals and said mirror current, said first current cell including a first plurality of least significant current cells each responsive to said first set of complementary control signals and to said mirror current for generating a first complementary output current on said complementary output; and a second current cell receiving said second set of complementary control signals and said mirror current, said second current cell including a second plurality of least significant current cells each responsive to said second set of complementary control signals and to said mirror current for generating a second complementary output current on said complementary output.

3. The CMOS digital to analog converter of claim 2 wherein each said least significant current cell comprises:

a first and second matching MOS transistor that each match said match transistor, each MOS transistor having a first terminal node, a second terminal node and a gate terminal node, said gate terminal nodes receiving said mirror current for controlling an operating current between said first terminal node and second terminal node and wherein said first terminal node of said first MOS transistor is coupled to a first output node of said complementary output and said first terminal node of said second MOS transistor is coupled to a second output node of said complementary output;

a first current source having a first current terminal coupled to said second terminal node of said first MOS transistor and a second current terminal coupled to a voltage reference level, said first current source responsive to a first control signal of said set of complementary control signals for switching a first operating current through said first MOS transistor on when said first control signal has a first value and switching said first operating current through said first MOS transistor off when said first control signal has a second value; and a second current source having a first current terminal coupled to said second terminal node of said second MOS transistor and a second current terminal coupled to said voltage reference level, said second current source responsive to a second control signal of said set of complementary control signals for switching a second operating current through said second MOS transistor on when said second control signal has a first value and switching said second operating current through said second MOS transistor off when said second control signal has a second value.

4. The CMOS digital to analog converter of claim 2 wherein said controller further provides an enable signal, the converter further comprising:

an enable circuit having a first terminal coupled to said mirror current terminal and a second terminal coupled to said voltage reference level and responsive to said enable signal for disabling each least significant current cell of said first and second sets of least significant current cells.

* * * * *